(12) United States Patent
Sakai et al.

(10) Patent No.: US 10,218,348 B2
(45) Date of Patent: Feb. 26, 2019

(54) CONTROL CIRCUIT

(71) Applicant: Mitsubishi Electric Corporation, Tokyo (JP)

(72) Inventors: Shinji Sakai, Tokyo (JP); Hisashi Oda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/767,657

(22) PCT Filed: Jan. 22, 2016

(86) PCT No.: PCT/JP2016/051844
§ 371 (c)(1),
(2) Date: Apr. 12, 2018

(87) PCT Pub. No.: WO2017/126103
PCT Pub. Date: Jul. 27, 2017

(65) Prior Publication Data
US 2018/0309435 A1    Oct. 25, 2018

(51) Int. Cl.
H03K 17/08     (2006.01)
H03K 17/0812   (2006.01)
H03K 17/06     (2006.01)

(52) U.S. Cl.
CPC ..... *H03K 17/08122* (2013.01); *H03K 17/063* (2013.01)

(58) Field of Classification Search
None
See application file for complete search history.

(56) References Cited

U.S. PATENT DOCUMENTS

| 7,521,878 B2 * | 4/2009 | Green | H02M 5/458 |
| | | | 315/209 R |
| 8,558,585 B2 * | 10/2013 | Ishimatsu | H03K 17/0822 |
| | | | 327/108 |
| 2013/0241621 A1 | 9/2013 | Forghani-Zadeh et al. | |

FOREIGN PATENT DOCUMENTS

JP    2015-511112 A    4/2015

OTHER PUBLICATIONS

International Search Report issued in PCT/JP2016/051844; dated Apr. 26, 2016.
Written Opinion issued in PCT/JP2016/051844; dated Apr. 26, 2016.

(Continued)

*Primary Examiner* — Jeffrey S Zweizig
(74) *Attorney, Agent, or Firm* — Studebaker & Brackett PC

(57) ABSTRACT

A control circuit includes an inverter circuit including a high-side MOSFET and a low-side MOSFET connected to form a totem-pole, a first gate driver configured to switch the low-side MOSFET, a second gate driver configured to switch the high-side MOSFET, a bootstrap circuit configured to supply a voltage to the second gate driver, and a detection section configured to issue an anomaly signal when a current larger than a predetermined value flows in the inverter circuit. In response to the issuing of the anomaly signal, the low-side MOSFET is turned off, and the high-side MOSFET is turned off. After that, in a state in which a freewheeling current is flowing through the low-side MOSFET, the low-side MOSFET is turned on to prevent a bootstrap capacitor of the bootstrap circuit from being overcharged.

8 Claims, 7 Drawing Sheets

(56) References Cited

OTHER PUBLICATIONS

Notification of Transmittal of the International Search Report and the Written Opinion of the International Searching Authority, or the Declaration issued in PCT/JP2016/051844; dated Apr. 26, 2016.
Translation of the International Preliminary Report on Patentability issued in corresponding International Application No. PCT/JP2016/051844; dated Aug. 2, 2018.

* cited by examiner

CONTROL CIRCUIT

FIELD

This invention relates to a control circuit used to control an inverter circuit.

BACKGROUND

In inverter control, bootstrap systems are mainly used to supply a power supply for a high-side gate driver from a power supply for a low-side gate driver. In the case where an inductive load is driven by an inverter circuit using MOSFETs, a freewheeling current of the inductive load flows back into a MOSFET, and the drain potential, which is the potential at a high-side main electrode terminal, becomes lower than the source potential, which is the potential at a low-side main electrode terminal. In particular, in the case where the freewheeling current flows through the low-side MOSFET, the drain potential thereof being lower than the source potential causes a bootstrap capacitor having one end connected to the drain terminal to be overcharged. The overcharge of the bootstrap capacitor may cause overvoltage in the gate driver or the MOSFET. In particular, in the case where an excessive principal current triggers protective operation to turn off the low-side MOSFET and cause a freewheeling current to flow, the freewheeling current also becomes a relatively large current. Accordingly, this problem becomes significant.

Patent literature 1 discloses a technique for solving this problem. In Patent literature 1, a half-bridge power circuit using GaN FETs as switching elements includes a bootstrap capacitor clamp circuit installed in series with a charging path of a bootstrap capacitor. Accordingly, even if the potential on the switching element side of the bootstrap capacitor becomes an excessively negative potential, control can be performed so that the voltage to which the bootstrap capacitor is charged may be constant.

PRIOR ART

Patent Literature

Patent literature 1: Japanese Translation of PCT International Application Publication No.

SUMMARY

Technical Problem

However, the technique disclosed in Patent literature 1 has the following problems:

A floating power supply is additionally required for driving a bootstrap capacitor clamp circuit;

Analog control for maintaining bootstrap capacitor voltage constant is required, and control is complicated, e.g., feedback to the amplifier 385; and A charging current is limited by the Pch-MOSFET 380 located on the bootstrap charging path, or volume and cost are needed to ensure an energizing capability.

Accordingly, a control circuit that reduces the overcharge of a bootstrap capacitor with a simple configuration has been demanded.

The present invention has been accomplished to solve the above-described problems, and an object of the present invention is to provide a control circuit that can reduce the overcharge of a bootstrap capacitor of a bootstrap circuit with a simple configuration.

Means for Solving the Problems

According to a present invention, a control circuit includes an inverter circuit including a totem-pole configuration having a high-side MOSFET and a low-side MOSFET connected to form a totem-pole, a first gate driver configured to switch the low-side MOSFET, a second gate driver configured to switch the high-side MOSFET, a bootstrap circuit configured to supply a voltage to the second gate driver, and a detection section configured to issue an anomaly signal when a current larger than a predetermined value flows in the inverter circuit, wherein in response to issuing of the anomaly signal, the first gate driver turns off the low-side MOSFET, and the second gate driver turns off the high-side MOSFET, and after that, in a state in which a freewheeling current is flowing through a body diode of the low-side MOSFET, the first gate driver turns on the low-side MOSFET to execute protective operation for preventing a bootstrap capacitor of the bootstrap circuit from being overcharged.

Other features of the present invention will become apparent from the following description.

Advantageous Effects of the Invention

In this invention, a control circuit that employs a bootstrap charging system turns on a low-side MOSFET in a state in which a freewheeling current is flowing through the body diode of the low-side MOSFET. Accordingly, the overcharge of a bootstrap capacitor can be reduced.

DESCRIPTION OF EMBODIMENTS

Control circuits according to embodiments of the present invention will be described with reference to the drawings. The same or corresponding components will be denoted by the same reference signs, and the repetition of explanation thereof may be avoided.

Embodiment 1

Figure 1:
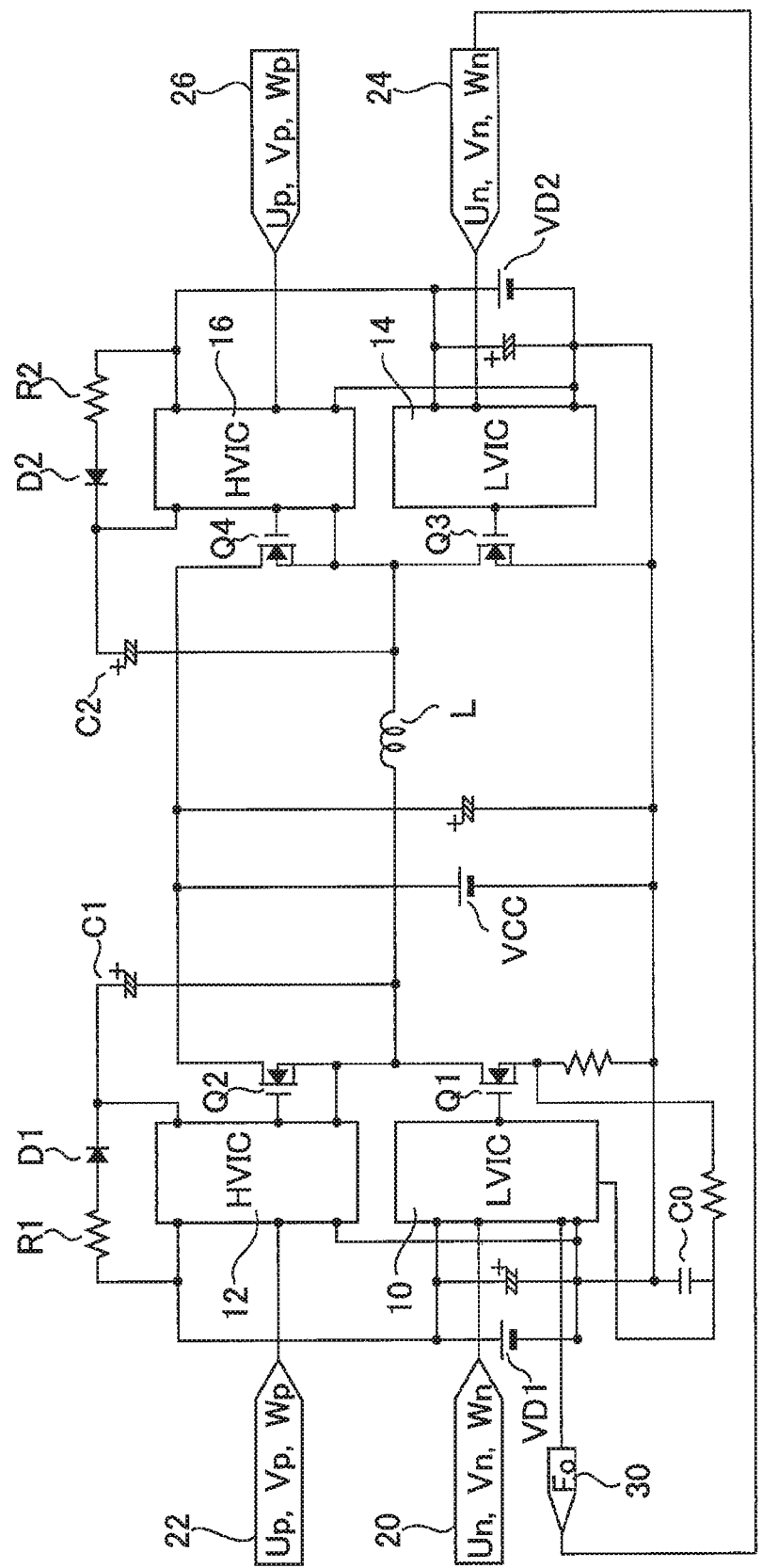
FIG. 1 is a circuit diagram of a control circuit according to embodiment 1.

FIG. 1 is a circuit diagram of a control circuit according to embodiment 1 of the present invention. The control circuit controls an inverter circuit. The inverter circuit includes a totem-pole configuration having a high-side MOSFET Q2 and a low-side MOSFET Q1 connected to form a totem-pole and a totem-pole configuration having a high-side MOSFET Q4 and a low-side MOSFET Q3 connected to form a totem-pole. The four MOSFETs constitute a full-bridge circuit. This full-bridge circuit allows an alternating current to be supplied to an inductance L, which is a load.

The low-side MOSFETs Q1 and Q3 are switched by first gate drivers 10 and 14, respectively. The high-side MOSFETs Q2 and Q4 are switched by second gate drivers 12 and 16, respectively. All the MOSFETs are formed of, for example, silicon. The forward voltage drops VF of body diodes of the low-side MOSFETs Q1 and Q3 in on states are lower than the forward voltage drops VF of the body diodes of the low-side MOSFETh Q1 and Q3 in off states.

A supply voltage for the first gate driver 10 is supplied from a power source VD1. A supply voltage for the second gate driver 12 is supplied by raising the voltage of the power source VD1 with a bootstrap circuit including a bootstrap diode D1 and a bootstrap capacitor C1.

A supply voltage for the first gate driver 14 is supplied from a power source VD2. A supply voltage for the second gate driver 16 is supplied by raising the voltage of the power source VD2 with a bootstrap circuit including a bootstrap diode D2 and a bootstrap capacitor C2.

As described above, voltages obtained by raising supply voltages with bootstrap circuits are used as supply voltages for the second gate drivers 12 and 16. In other words, the bootstrap circuits supply the second gate drivers 12 and 16 with voltages.

Terminals 20, 22, 24, and 26 are connected to the first gate driver 10, the second gate driver 12, the first gate driver 14, and the second gate driver 16, respectively. Control signals are supplied to the gate drivers through the terminals 20, 22, 24, and 26 from the outside.

Figure 2:
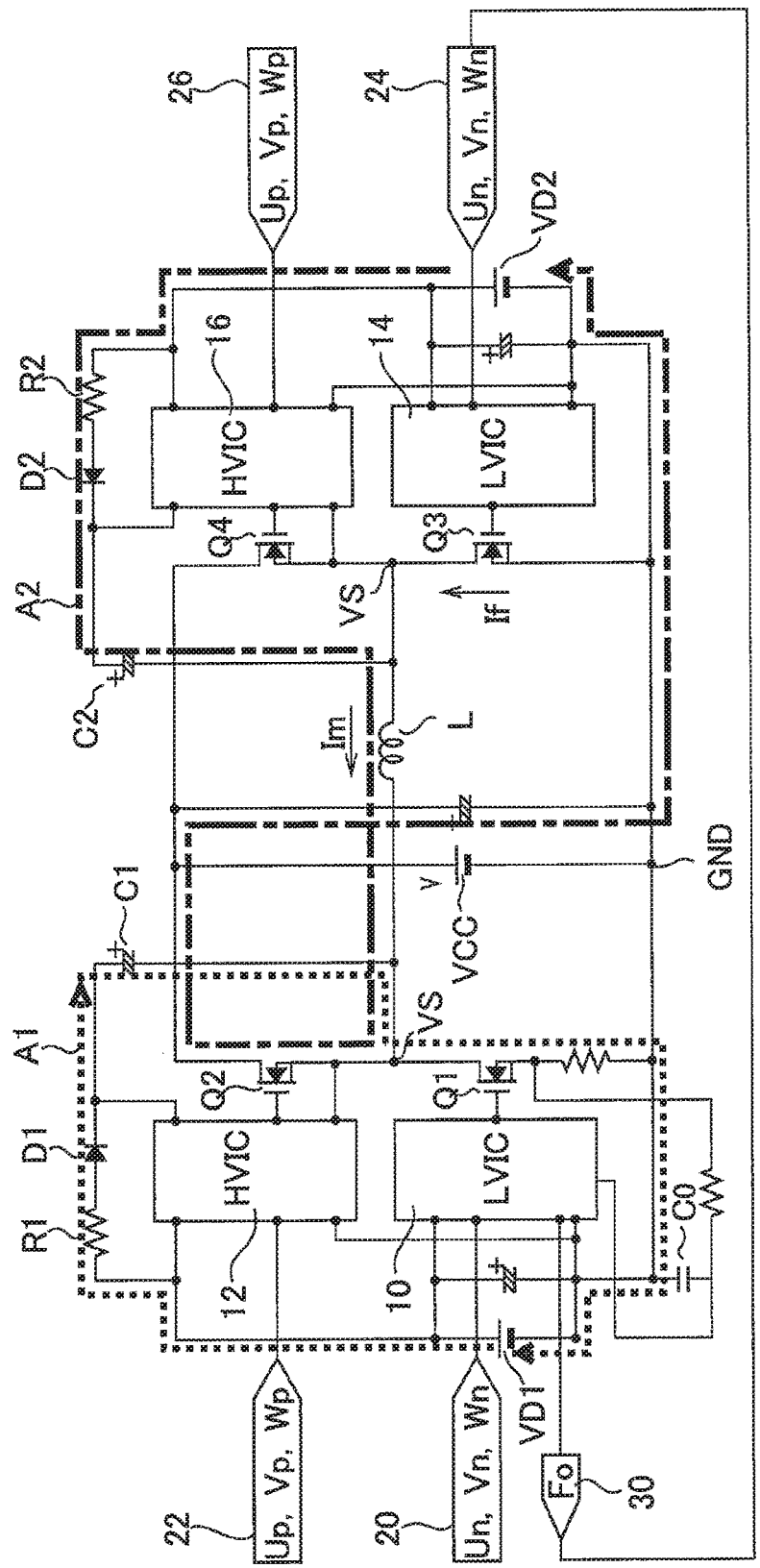
FIG. 2 is a view for explaining a method for charging the bootstrap capacitor.

FIG. 2 is a view for explaining a method for charging the bootstrap capacitors C1 and C2. A current is passed through a path indicated by dashed line A1 to charge the bootstrap capacitor C1. Specifically, the low-side MOSFET Q1 is turned on to charge the bootstrap capacitor C1 with a current flowing from the power source VD1 for the first gate driver 10 through the bootstrap diode D1.

Similarly, the bootstrap capacitor C2 is charged. Specifically, the low-side MOSFET Q3 is turned on to charge the bootstrap capacitor C2 with a current flowing from the power source VD2 for the first gate driver 14 through the bootstrap diode D2.

When a freewheeling current flows through the high-side MOSFET Q2 and the low-side MOSFET Q3, VS potential is pulled down to a negative potential lower than GND by an amount corresponding to VF of the body diode of the low-side MOSFET Q3. VS potential is a potential at a connection point between the high-side MOSFET Q4 and the low-side MOSFET Q3 or a connection point between the high-side MOSFET Q2 and the low-side MOSFET Q1. VS potential is a reference potential for the bootstrap capacitor C1. When a freewheeling current If flows and VS potential is pulled down to a negative voltage lower than GND, the bootstrap capacitors are brought into a charging mode. The flow of a charging current is indicated by dashed-dotted line A2 in FIG. 2. The charging current causes overvoltage in the bootstrap capacitor C2 by an amount corresponding to the negative potential of VS, and the bootstrap capacitor C2 is overcharged.

The control circuit according to embodiment 1 of the present invention reduces the overcharge of a bootstrap capacitor by carrying out the following steps.

1. Anomaly Detection Step

Anomaly detection means detecting a current larger than a predetermined value flowing in the inverter circuit. The control circuit of the present invention includes a detection section for detecting a current larger than a predetermined value which flows in the inverter circuit. The detection section in embodiment 1 is the first gate driver 10. Specifically, the first gate driver 10 has a current sense IC for the low-side MOSFET Q1, and the current sense IC detects a current in the inverter circuit. When a principal current in the inverter circuit becomes larger than a predetermined value, the detection section issues an anomaly signal. For example, when a principal current flowing through the high-side MOSFET Q4, the inductance L, and the low-side MOSFET Q1 becomes larger than a predetermined value, the first gate driver 10 issues an anomaly signal Fo to the first gate driver 14. The anomaly signal Fo is denoted by reference numeral 30. It should be noted that the anomaly signal Fo is transmitted to all the gate drivers, not only the first gate driver 14.

Figure 3:
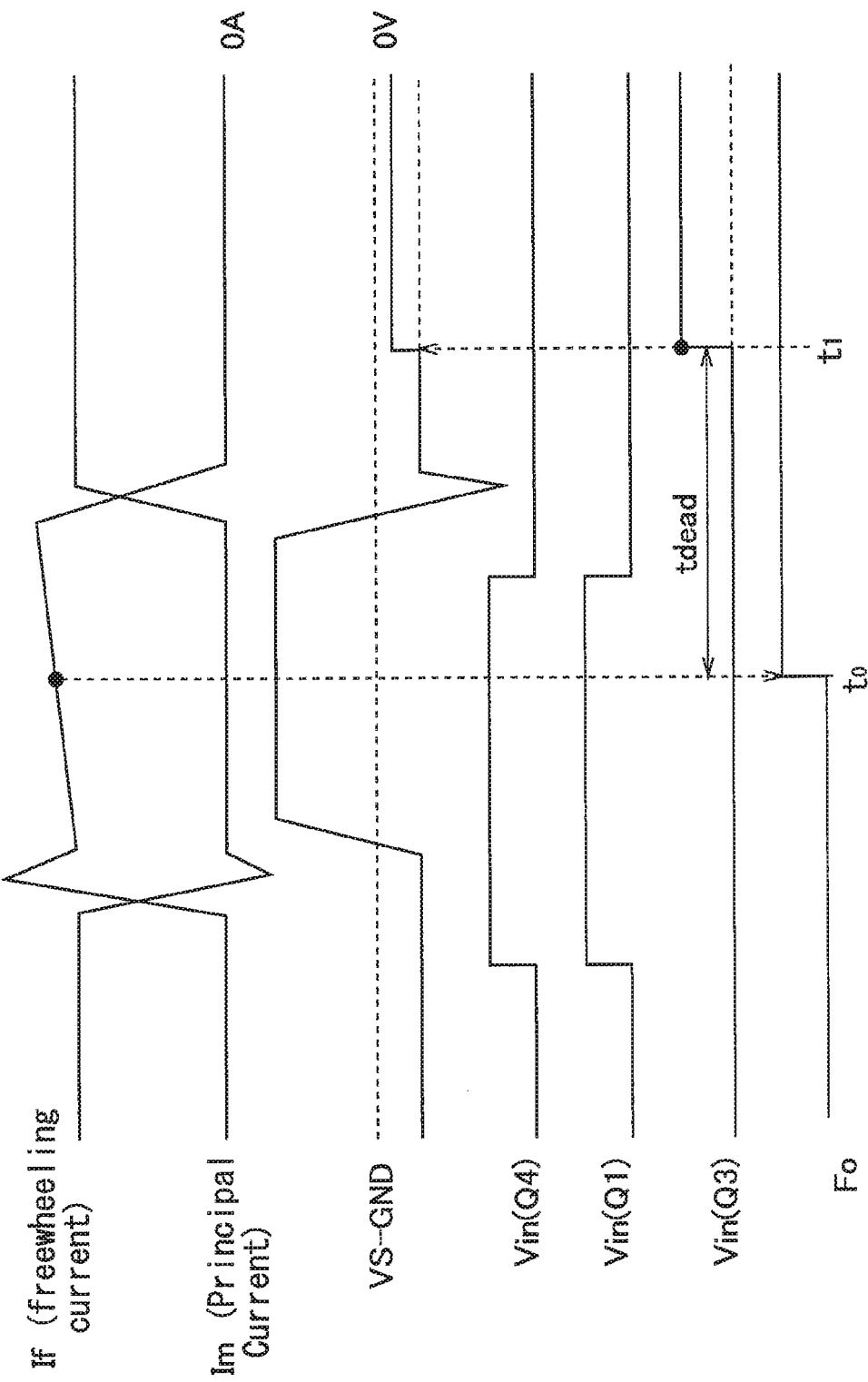
FIG. 3 is a timing diagram showing the operation of the control circuit.

FIG. 3 is a timing diagram showing the operation of the control circuit. The sign If represents the waveform of a freewheeling current flowing through the body diode of the low-side MOSFET Q3. The sign Im represents the waveform of the principal current. The sign VS-GND represents the difference between VS potential and GND potential. The sign Vin (Q4) represents an input signal to the gate of the high-side MOSFET Q4. The sign Vin (Q1) represents an input signal to the gate of the low-side MOSFET Q1. The sign Vin (Q3) represents an input signal to the gate of the low-side MOSFET Q3. The sign Fo represents an anomaly signal. FIG. 3 shows that the anomaly signal Fo is issued when the principal current becomes larger than the predetermined value.

2. Stoppage Step

In response to the anomaly signal Fo issued in the anomaly detection step, a stoppage step is performed. In the stoppage step, the first gate drivers 10 and 14 turn off the low-side MOSFETs Q1 and Q3, and the second gate drivers 12 and 16 turn off the high-side MOSFETs Q2 and Q4. Thus, all the four MOSFETs are shut off. FIG. 3 shows that the high-side MOSFET Q4 and the low-side MOSFET Q1 are turned off after the anomaly signal Fo is issued.

3. Protective Operation

When the stoppage stop is ended, a freewheeling current flows through the high-side MOSFET Q2 and the low-side MOSFET Q3. FIG. 2 shows the freewheeling current If flowing through the low-side MOSFET Q3. When the freewheeling current If flows through the low-side MOSFET Q3, a current flows through the path indicated by dashed-dotted line A2 in FIG. 2. VS potential is a negative potential lower than GND by an amount corresponding to VF of the body diode in a state in which a freewheeling current is flowing through the body diode of the low-side MOSFET Q3. Accordingly, the bootstrap capacitor C2 may be overcharged. To cope with this, protective operation is executed when a predetermined time tdead elapses since the issuing of the anomaly signal.

Specifically, the first gate driver 14 turns on the low-side MOSFET Q3 in a state in which a freewheeling current is flowing through the body diode of the low-side MOSFET Q3. This decreases VF of the body diode. FIG. 3 shows that the low-side MOSFET Q3 is turned on at time t1 to decrease VS-GND. This operation is referred to as protective operation. The protective operation prevents the bootstrap capacitors of the bootstrap circuits from being overcharged.

The time tdead is long enough to ensure that the protective operation is started to turn on the low-side MOSFETs after all the MOSFETs are turned off in the stoppage step. Since the low-side MOSFET Q3 is turned on after the high-side MOSFETs Q2 and Q4 are turned off, the high-side MOSFET and the low-side MOSFET which constitute a totem-pole configuration are prevented from being turned on at the same time and allowing L current, which is a principal current, to flow.

Thus, the control circuit of embodiment 1 of the present invention prevents a bootstrap capacitor from being overcharged by turning on a low-side MOSFET in the case where a freewheeling current flowing through the body diode of the low-side MOSFET causes a decrease in the potential at one end of the bootstrap capacitor and may cause the overcharge of the bootstrap capacitor. This protective operation is very simple operation, and does not require additional parts. Accordingly, the overcharge of a bootstrap capacitor of a bootstrap circuit can be reduced with a simple configuration.

The inverter circuit is not limited to a full-bridge circuit. The inverter circuit may be any inverter circuit having a totem-pole configuration other than a full-bridge circuit. For example, the inverter circuit may be a three-phase inverter circuit. The detection section may be any circuit that issues an anomaly signal when a current larger than a predetermined value flows in the inverter circuit. For example, the first gate driver 14 may have a function that serves as the detection section. In that case, the first gate driver 14 monitors a principal current, and issues an anomaly signal when the principal current becomes larger than a predetermined value.

In embodiment 1, the four MOSFETs are made of silicon. However, the MOSFETs may be made of a wide bandgap semiconductor having a larger bandgap than silicon. Examples of the wide bandgap semiconductor include silicon carbide, gallium nitride-based materials, and diamond. When VS-GND for a freewheeling current flowing through a MOSFET made of silicon is assumed to be approximately −0.6 V, VS-GND for a freewheeling current flowing through a MOSFET made of a wide bandgap semiconductor will be as high as, for example, approximately −2.6 V. Accordingly, in the case where a wide bandgap semiconductor is employed, the overcharge of the bootstrap capacitor is a serious problem. Thus, the control circuit of the present invention is particularly effective in the case where MOSFETs are made of a wide bandgap semiconductor.

Various other modifications can be made without departing from the characteristics of the present invention. These modifications can also be appropriately applied to control circuits according to embodiments below. It should be noted that the control circuits according to the embodiments below have many things in common with that of embodiment 1, and therefore differences with embodiment 1 will be mainly described.

Embodiment 2

Protective operation by a control circuit of embodiment 2 is different from the protective operation of embodiment 1. In embodiment 2, the first gate driver gives a PWM signal to the low-side MOSFET in the protective operation.

Figure 4:
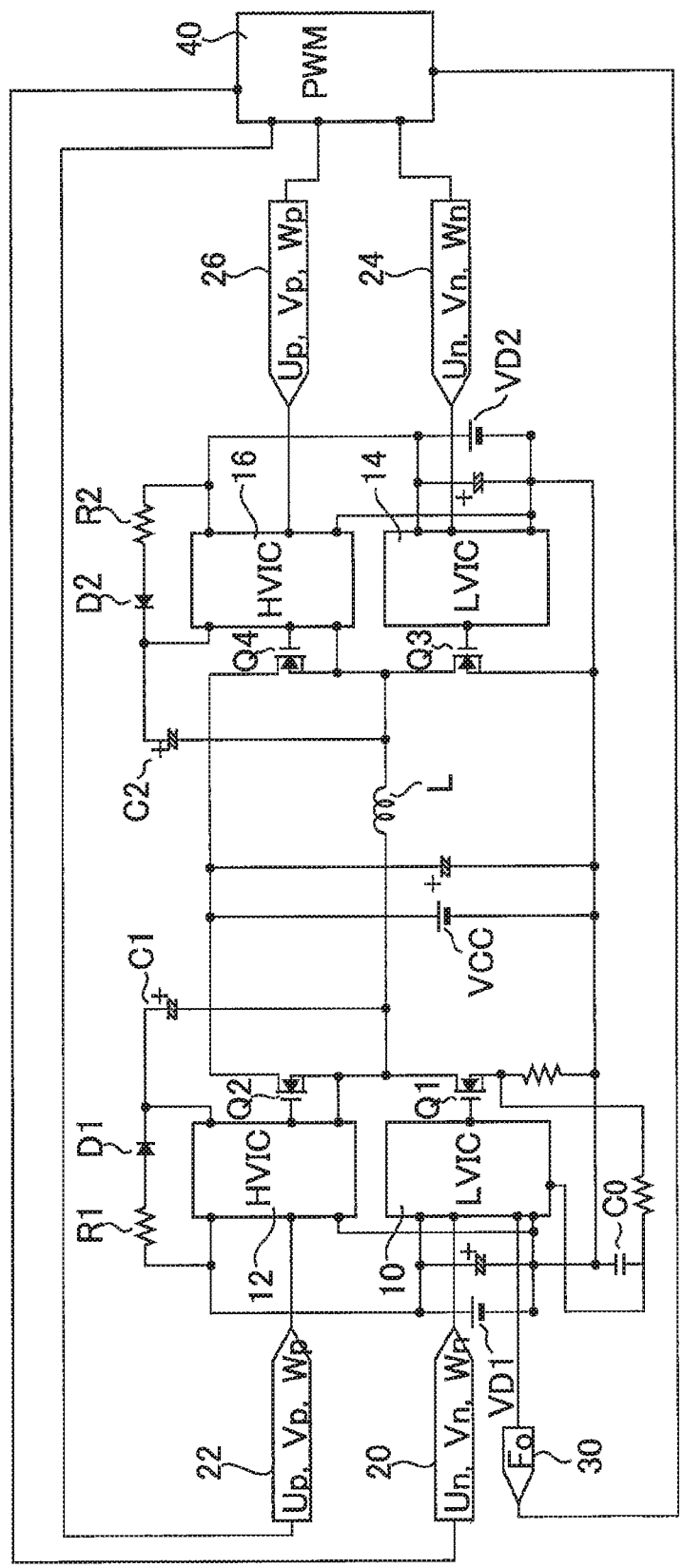
FIG. 4 is a circuit diagram of the control circuit according to embodiment 2.

FIG. 4 is a circuit diagram of the control circuit according to embodiment 2. A microcomputer 40 that generates PWM signals is connected to the first gate drivers 10 and 14 and the second gate drivers 12 and 16. The first gate drivers 10 and 14 and the second gate drivers 12 and 16 turn on and off the MOSFETs based on the PWM signals sent by the microcomputer 40. The microcomputer 40 is configured to receive an anomaly signal Fo from the first gate driver 10.

Figure 5:
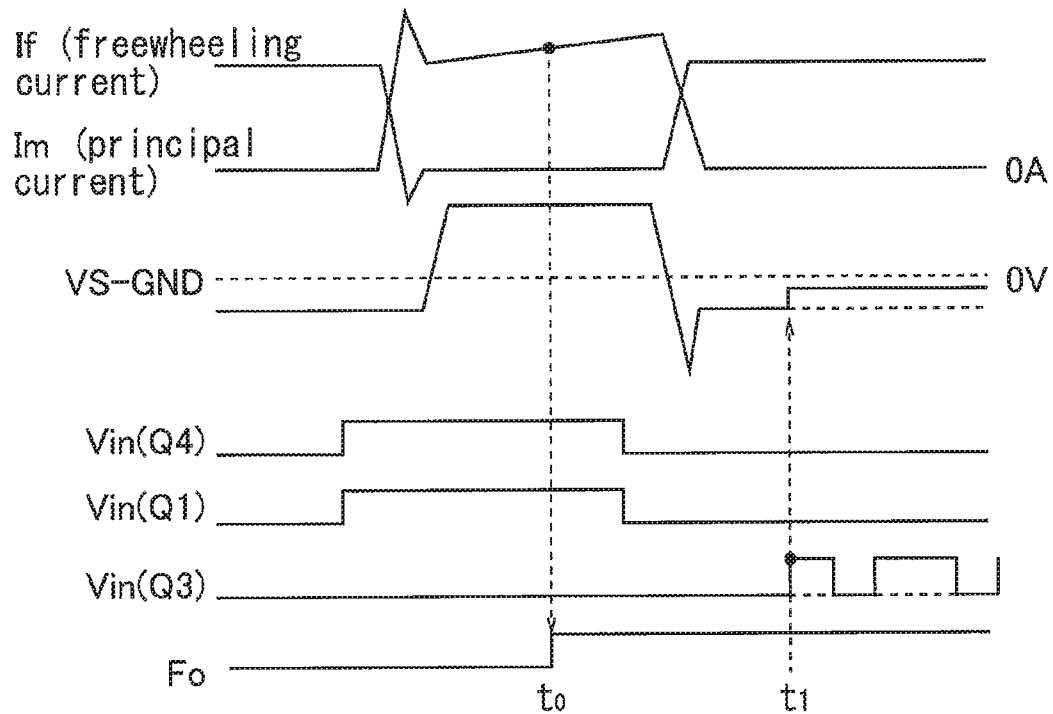
FIG. 5 is a timing diagram showing the operation of the control circuit.

In the step of performing the protective operation, the microcomputer 40 supplies a PWM signal to the first gate driver 14 to apply the PWM signal to the low-side MOSFET Q3. This causes the low-side MOSFET Q3 to be repeatedly turned on and off. FIG. 5 shows that the low-side MOSFET Q3 is turned on with the PWM signal at time t1. Turning on the low-side MOSFET Q3 in this way decreases VF of the low-side MOSFET Q3, and the decrease in VF reduces the overcharge of the bootstrap capacitor C2. Also, there is no need to prepare a new signal pattern for the protective operation, and an existing PWM signal can be used. Thus, processing is simplified.

Embodiment 3

The operation of a control circuit according to embodiment 3 has a feature in the anomaly detection step. In embodiment 3, when the temperature of the inverter circuit becomes higher than a predetermined value, the detection section issues an anomaly signal. When an overcurrent flows in the inverter circuit, the temperature of the inverter circuit becomes high. Accordingly, the overcurrent is detected by detecting high temperature of the inverter circuit.

Figure 6:
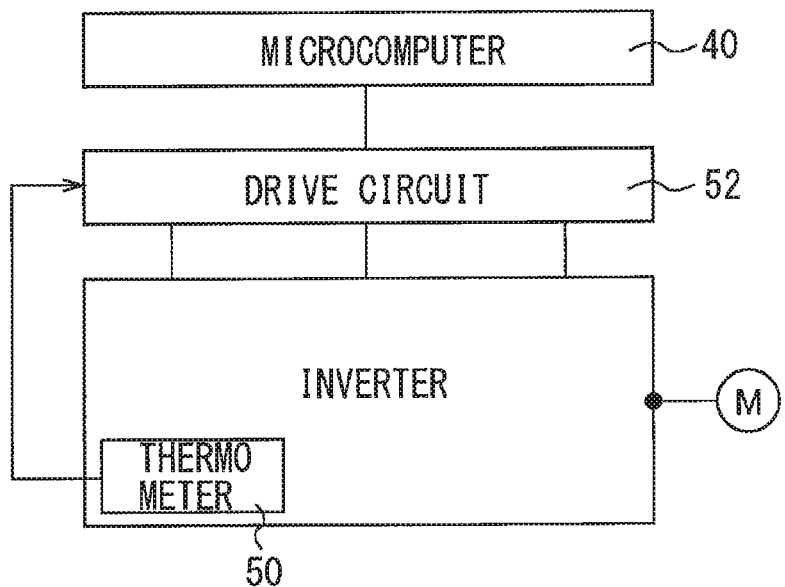
FIG. 6 is a diagram showing the configuration of the control circuit according to embodiment 3.

FIG. 6 is a diagram showing the configuration of the control circuit according to embodiment 3. The inverter circuit includes a thermometer 50 for measuring the temperature of the inverter circuit. The result of measurement by the thermometer 50 is transmitted to a drive circuit 52 for driving the MOSFETs. The drive circuit 52 has a function that serves as the detection section, and determines whether the temperature of the inverter circuit is higher than a predetermined value. If the temperature of the inverter circuit is higher than the predetermined value, the drive circuit 52 issues an anomaly signal.

Figure 7:
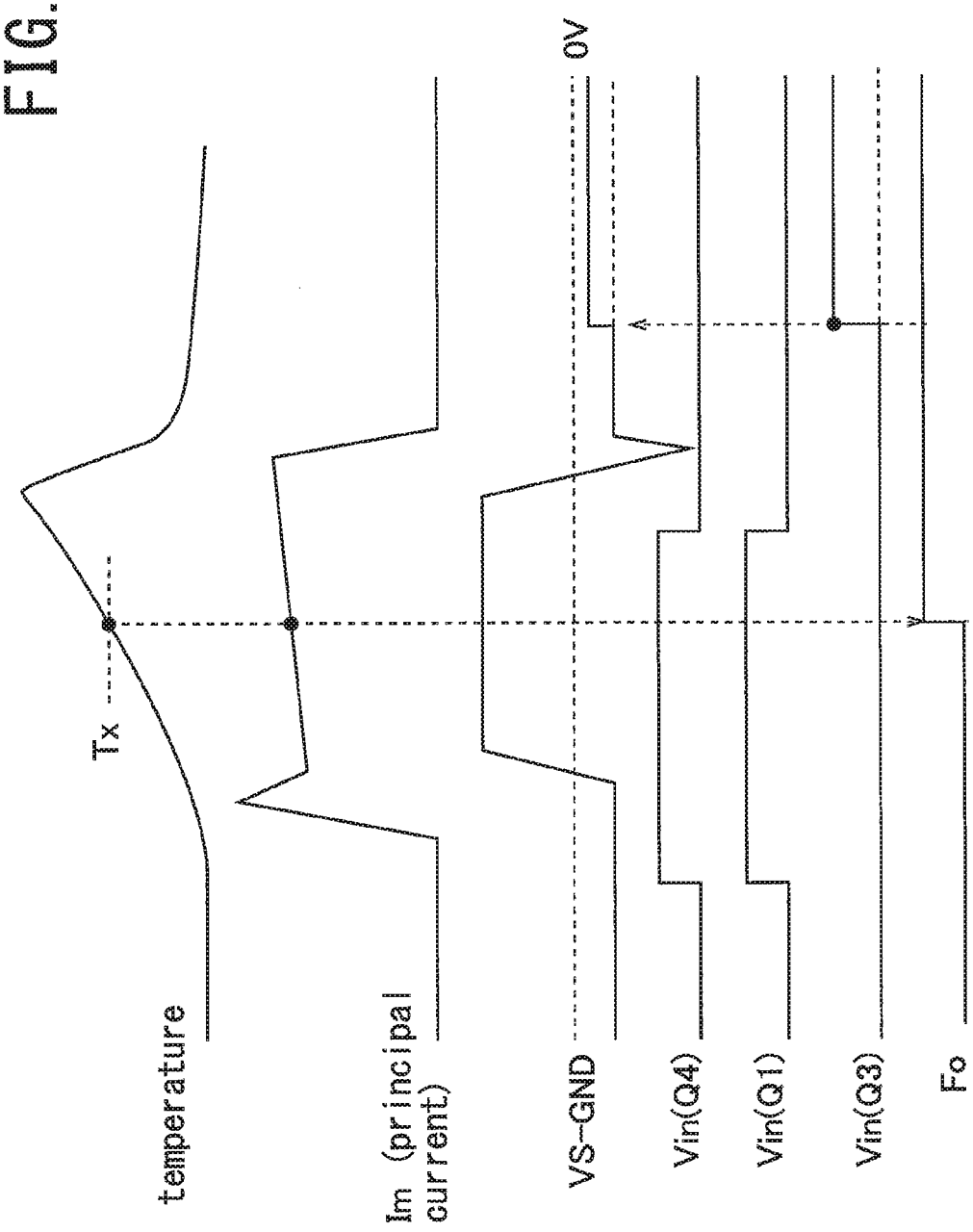
FIG. 7 is a timing diagram showing the operation of the control circuit.

FIG. 7 is a timing diagram showing the operation of the control circuit according to embodiment 3. In FIG. 7, "temperature" means the temperature measured by the thermometer 50. When the temperature increases to be higher than a predetermined value Tx, the anomaly signal Fo is issued, and the stoppage step is carried out. After that, the protective operation, in which the low-side MOSFET Q3 is turned on, is carried out.

Monitoring the temperature, instead of monitoring the principal current, improves the degree of freedom in designing. Moreover, anomaly detection in which the temperature is monitored may be used with anomaly detection in which the sense current is monitored.

Embodiment 4

In a control circuit of embodiment 4, the first gate driver does not execute the protective operation unless the voltage raised by the bootstrap circuit becomes higher than a predetermined value.

Figure 8:
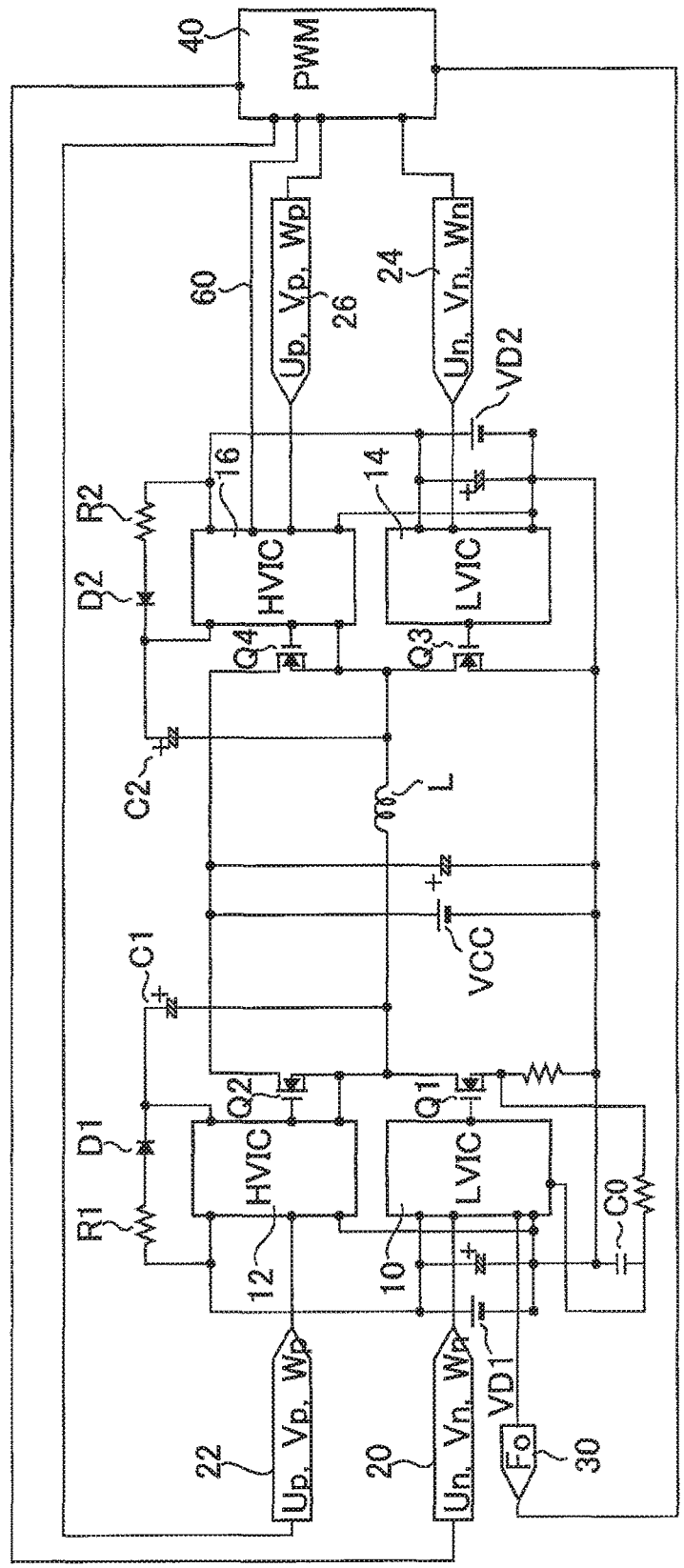
FIG. 8 is a circuit diagram of the control circuit according to embodiment 4.

FIG. 8 is a circuit diagram of the control circuit according to embodiment 4. The second gate driver 16 that turns on and off the high-side MOSFET Q4 and the microcomputer 40 are connected with a connecting wire 60. This connection allows the microcomputer 40 to monitor the supply voltage for the second gate driver 16. The supply voltage for the second gate driver 16 is equal to the voltage raised by the bootstrap circuit.

In embodiment 1, the low-side MOSFET Q3 is turned on in the step of executing the protective operation. Meanwhile, in embodiment 4, the microcomputer 40 monitors the voltage raised by the bootstrap circuit in the step of executing the protective operation. Unless the voltage becomes higher than a predetermined value, the first gate driver 14 does not execute the protective operation. If the voltage raised by the bootstrap circuit is higher than the predetermined value, the protective operation is executed.

As described above, in embodiment 4, if the anomaly signal Fo is issued and the voltage raised by the bootstrap circuit is higher than the predetermined value, the protective operation is executed. This allows the low-side MOSFET Q3 to be kept off in the case where there is no possibility that a short circuit in which no current flows through the inductance L may cause the overcharge of the bootstrap capacitor. Keeping the low-side MOSFET Q3 off eliminates the risk of an arm short circuit caused by turning on the low-side MOSFET Q3.

The Inverter circuit may have various protection circuits, such as an overcurrent protection circuit, a short-circuit protection circuit, a heat protection circuit, and a control supply voltage reduction protection circuit. Accordingly, the anomaly signal Fo may be issued even when an overcurrent does not flow in the inverter circuit. In such a case, it is unfavorable that the protective operation is automatically executed in response to the anomaly signal Fo being issued. For this reason, monitoring the "voltage raised by the bootstrap circuit" as described above is effective.

Embodiment 5

The detection section of a control circuit according to embodiment 5 issues an anomaly signal when the on-state voltage (VDS) of the low-side MOSFET Q3 becomes higher than a predetermined value. This provides effects similar to those of the control circuit of embodiment 1. Such a detection section contributes to the improvement of the degree of freedom in designing.

It should be noted that features of the control circuits according to the above-described embodiments may be appropriately combined to improve advantageous effects of the present invention.

DESCRIPTION OF SYMBOLS 10, 14 first gate driver, 12, 16 second gate driver, C1,C2 bootstrap capacitor, Q1,Q3 low-side MOSFET, Q2,Q4 high-side MOSFET

The invention claimed is:

1. A control circuit comprising:
an inverter circuit comprising a totem-pole configuration comprising a high-side MOSFET and a low-side MOSFET connected to form a totem-pole;
a first gate driver configured to switch the low-side MOSFET;
a second gate driver configured to switch the high-side MOSFET;
a bootstrap circuit configured to supply a voltage to the second gate driver; and
a detection section configured to issue an anomaly signal when a current larger than a predetermined value flows in the inverter circuit,
wherein in response to issuing of the anomaly signal, the first gate driver turns off the low-side MOSFET, and the second gate driver turns off the high-side MOSFET, and
after that, in a state in which a freewheeling current is flowing through a body diode of the low-side MOSFET, the first gate driver turns on the low-side MOSFET to execute protective operation for preventing a bootstrap capacitor of the bootstrap circuit from being overcharged.

2. The control circuit according to claim 1, wherein the detection section issues the anomaly signal when a principal current of the inverter circuit becomes larger than a predetermined value.

3. The control circuit according to claim 1, wherein the first gate driver supplies a PWM signal to the low-side MOSFET in the protective operation.

4. The control circuit according to claim 1, wherein the detection section issues the anomaly signal when temperature of the inverter circuit becomes higher than a predetermined value.

5. The control circuit according to claim 1, wherein the first gate driver does not execute the protective operation unless a voltage raised by the bootstrap circuit becomes larger than a predetermined value.

6. The control circuit according to claim 1, wherein the detection section issues the anomaly signal when an on-state voltage of the low-side MOSFET becomes higher than a predetermined value.

7. The control circuit according to claim 1, wherein the high-side MOSFET and the low-side MOSFET comprise a wide bandgap semiconductor.

8. The control circuit according to claim 7, wherein the wide bandgap semiconductor comprises any one of silicon carbide, a gallium nitride-based material, and diamond.

* * * * *